(12) United States Patent
Appelt et al.

(10) Patent No.: US 6,215,649 B1
(45) Date of Patent: Apr. 10, 2001

(54) PRINTED CIRCUIT BOARD CAPACITOR STRUCTURE AND METHOD

(75) Inventors: Bernd K. Appelt, Endicott; John M. Lauffer, Waverly, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/186,583

(22) Filed: Nov. 5, 1998

(51) Int. Cl.[7] .............................. H01G 4/20; H01G 4/30; H05K 1/18
(52) U.S. Cl. ...................... 361/312; 361/763; 361/301.4; 361/323
(58) Field of Search .............................. 361/301.1, 301.2, 361/301.4, 301.5, 311, 312, 306.3, 323, 324, 321, 321.1–321.5, 761, 762, 763

(56) References Cited

U.S. PATENT DOCUMENTS

| | | | |
|---|---|---|---|
| 2,539,329 | * 1/1951 | Sanders et al. | 442/117 |
| 2,842,726 | * 7/1958 | Robinson et al. | 361/313 |
| 3,136,680 | * 6/1964 | Hochberg | 442/117 |
| 3,649,892 | 3/1972 | Booe . | |
| 3,806,775 | 4/1974 | Edman . | |
| 3,886,415 | * 5/1975 | Genthe | 361/314 |
| 4,873,610 | * 10/1989 | Shimizu et al. | 361/313 |
| 4,996,097 | 2/1991 | Fischer . | |
| 5,010,641 | 4/1991 | Sisler . | |
| 5,079,069 | 1/1992 | Howard et al. . | |
| 5,155,655 | 10/1992 | Howard et al. . | |
| 5,161,086 | 11/1992 | Howard et al. . | |
| 5,162,977 | 11/1992 | Paurus et al. . | |
| 5,261,153 | 11/1993 | Lucas . | |
| 5,742,471 | * 4/1998 | Barbee, Jr. et al. | 361/312 |
| 5,745,334 | * 4/1998 | Hoffarth et al. | 361/313 |
| 5,796,587 | * 8/1998 | Lauffer et al. | 361/763 |
| 5,870,274 | * 2/1999 | Lucas | 361/311 |

* cited by examiner

Primary Examiner—Kristine Kincaid
Assistant Examiner—Eric Thomas
(74) Attorney, Agent, or Firm—James A. Lucas; Driggs, Lucas, Brubaker & Hogg Co., LPA

(57) ABSTRACT

A capacitive element for a circuit board or chip carrier having improved capacitance and method of manufacturing the same is provided. The structure is formed from a pair of conductive sheets having a dielectric component laminated therebetween. The dielectric component is formed of two or more dielectric sheets at least one of which can be partially cured or softened followed by being fully cured or hardened. The lamination takes place by laminating a partially cured or softened sheet to at least one other sheet of dielectric material and one of the sheets of conductive material. The total thickness of the two sheets of the dielectric component does not exceed about 4 mils and preferably does not exceed about 3 mils; thus the single dielectric sheets does not exceed about 2 mils and preferably does not exceed about 1.5 mils in thickness. The use of two or more sheets of dielectric material makes it very unlikely that two or more defects in the sheets of dielectric material will align thus greatly reducing the probability of a defect causing a failure in test or field use.

4 Claims, 3 Drawing Sheets

PRINTED CIRCUIT BOARD CAPACITOR STRUCTURE AND METHOD

BACKGROUND OF THE INVENTION

1. Field of the Invention

This invention relates generally to capacitive elements for circuit boards having improved decoupling capacitance reliability, and more particularly to a circuit board or chip carrier or the like and method of manufacturing the same wherein the board or chip carrier uses multiple layers of dielectric material yet achieves high capacitance.

2. Background Art

In the manufacture of circuit boards or chip carriers or the like it is desirable to create as high a capacitance as possible between various ground, voltage and signal planes to thereby minimize the amount of discrete decoupling capacitors required on the board surface. The equation for determining capacitance is C=eA/t where C is the capacitance, e is the dielectric constant or relative permittivity of the dielectric material, A is the available area, and t is the thickness of the dielectric material or the spacing between the plates of the capacitor. Thus to increase the capacitance of a capacitor of a given area one can select a material having an increased dielectric constant and/or decrease the thickness of the dielectric material. However, the selection of the dielectric material is often limited by many production and configuration limitations which leaves principal means of increasing the capacitance to a reduction in thickness of the dielectric material. However, a problem encountered with certain types of dielectric material especially epoxy impregnated glass cloth, but other materials as well, at thinner gauges is that any defects in the material in the form of pin holes or voids tend to extend from one surface to the other thus resulting in failure of the structure either under test conditions, or even worse they may pass testing but fail under field use conditions. Therefore it is desirable to form a circuit board or chip carrier having reduced thickness of the dielectric material for improved capacitance but with improved reliability.

SUMMARY OF THE INVENTION

According to the present invention a capacitive element for a circuit board or chip carrier having improved capacitance and method of manufacturing the same is provided. The structure is formed by selecting a pair of conductive sheets and laminating a dielectric component between the two sheets. The dielectric component is formed of two or more separate sheets of dielectric material at least one of which can be partially cured or softened followed by being fully cured or hardened. The lamination takes place by laminating a partially cured or softened sheet to at least one other sheet of dielectric material and one of the sheets of conductive material. The total thickness of the two sheets of the dielectric component should not exceed about 4 mils and preferably should not exceed about 3 mils; thus the single dielectric sheets should not exceed about 2 mils and preferably should not exceed about 1.5 mils in thickness. The use of two or more sheets of dielectric material makes it very unlikely that two or more defects in the sheets of dielectric material will align thus greatly reducing the probability of a defect causing a failure in test or field use.

In one embodiment a pair of ultra thin epoxy impregnated sheets of glass cloth are B-stage (partially) cured and then are laminated between two sheets of conducting material, preferably copper, with the lamination process fully curing the epoxy impregnated cloth to form the laminate structure. In other embodiments one or more sheets of dielectric material are laminated to one or more sheets of conductive material or a film of dielectric material is coated on one or more sheets of conductive material and B-stage cured or softened and then further laminated and fully cured or hardened to form the structure. In other embodiments sheets of various dielectric materials are laminated to each other and to copper sheets by various techniques. In still other embodiments films of dielectric material are coated on copper sheets and B-stage cured, laminated and fully cured. In yet other embodiments different dielectric materials are used to form the dielectric component; for example epoxy is first coated on opposite sides of another dielectric material such as a polyimide sheet, B-stage cured, and then further laminated to two sheets of conducting material.

BRIEF DESCRIPTION OF THE DRAWINGS

FIG. 4b shows the lamination of the components depicted in FIG. 4a;

FIG. 5b depicts the laminate structure of a circuit board using the component of FIG. 5a.

DESCRIPTION OF THE PREFERRED EMBODIMENTS

Figure 1A:
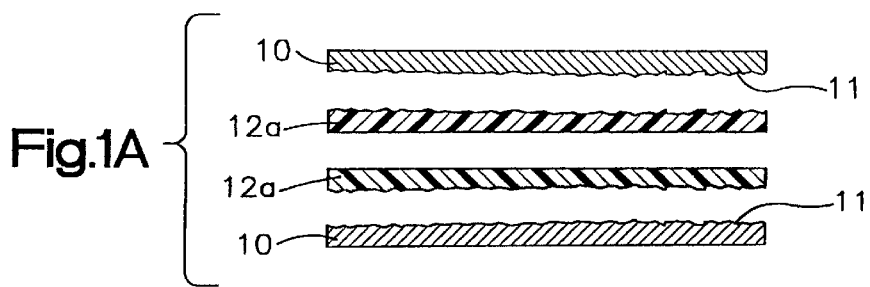
FIG. 1a is a side elevational view of the components of a circuit board assembled for lamination according to one embodiment of this invention.
Figure 1B:
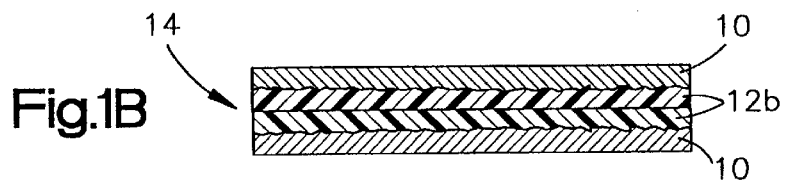
FIG. 1b is the components shown in FIG. 1a laminated together to form a circuit board element.

Referring now to the drawings, and for the present to FIGS. 1a and 1b one embodiment of the present invention is shown. FIG. 1a depicts a lay-up of the components of a circuit board according to one embodiment of this invention which components include a pair of conducting sheets of material 10, preferably copper. The copper can be either preferably ½ oz. or 1 oz. copper sheets, although thicker or thinner copper sheets could be used, suitable sheets being available from Gould Corp. other conductive material such as, but not limited to copper-Invar-copper, or copper on an aluminum carrier can be used. The sheets preferably have one surface 11 roughened to improve adhesion to other materials as is well known in the art. A pair of sheets 12a of dielectric material are provided, located between the copper sheets 10. The dielectric sheets are preferably ultra thin sheets of glass cloth which have been impregnated with an epoxy and partially (B-stage) cured. This B-stage curing is accomplished by heating to about 100° C. for about 5 to about 20 minutes. Preferably the cloths are 101 or 104 style glass cloths manufactured by Clark-Schwebel Inc. The 101 style cloth is about 1.0 to about 1.1 mil thick and the 104 glass cloth is about 1.5 mils thick. The epoxy resin preferably can be any one of several resins such as a phenolically hardened epoxy resin. Glass cloths impregnated with this type of resin are sold by IBM under the trade mark Driclad™. (As used herein the dielectric resinous material in its partially cured or softened stage is designated by the number eg "12" followed by the letter "a" thus "12a", and in the fully cured or hardened state by the number e.g. "12" followed by the letter "b" thus "12b".) The sheets of copper 10 and the sheets of dielectric material 12a are then laminated together in a laminating press at a temperature of from about 180° C. to about 200° C. at between about 300 psi to about 500 psi for about 1 to 2 hours. This will result not only in laminating the components but also in fully curing the impregnated B-stage cured cloth 12a resulting in a pair of fully cured glass cloths 12b laminated between a pair of copper sheets 10 to thus form the basis of a circuit board or chip carrier 14 as shown in FIG. 1b. The thickness of the two glass cloths 12b will be less than about 4 mils, and if style 101 cloth is used the thickness will be less than about 3 mils.

As indicated earlier one advantage of using two sheets of impregnated glass cloth is to greatly reduce the potential for failure of the structure due to defects such as pin holing in the manufacturing of the epoxy impregnated glass cloth. If a defect were to occur in one of the cloths it is highly unlikely that a similar defect would appear in the other cloth aligned or coincident with the defect in the first cloth; hence there is much less likelihood of failure of the part under testing or field conditions.

The laminate structure 14 forming the capacitive element can be further processed into a completed circuit board by any of a number of processes well known in the art. For example the copper sheets 10 may be used as voltage planes, e.g. a power plane and a ground plane. In such case clearance holes need to be provided in the copper sheets 10. This can be accomplished, for example, by photolithography and subtractive etching, as shown in FIGS. 1c and 1d.

Figure 1C:
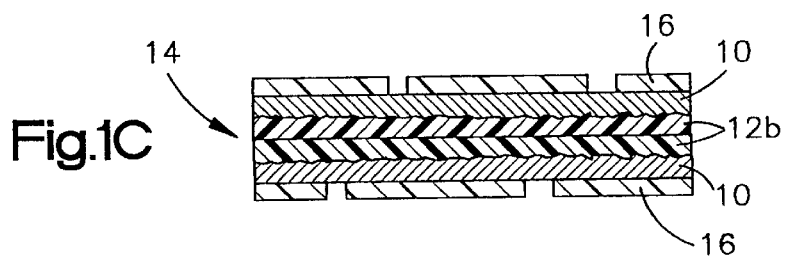
FIG. 1c is the board of FIG. 1b prepared for etching the copper sheets to form clearance holes.
Figure 1D:
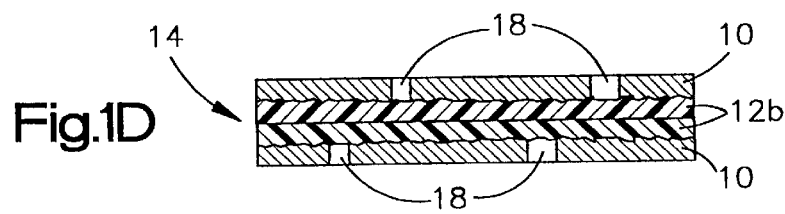
FIG. 1d is the board of FIG. 1c with the copper sheets etched to form the clearance holes.

Referring to FIG. 1c both of the copper sheets 10 are coated with a photoresist 16; and, using photolithography the photoresist is exposed and developed to reveal the underlying copper sheets 10 at the location that the clearance holes are to be formed. The revealed copper is then etched with conventional etchant to form holes 18 and the remaining photoresist stripped as seen in FIG. 1d. This structure can then be laminated with other structures, or be used as a base on which to form signal planes or connections to produce a completed circuit board or chip carrier using well known techniques.

Figure 2A:
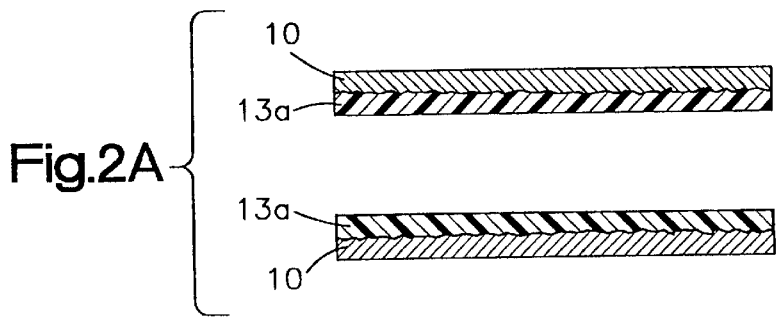
FIG. 2a is a side elevational view of the components of a circuit board assembled for lamination according to another embodiment of this invention.
Figure 2B:
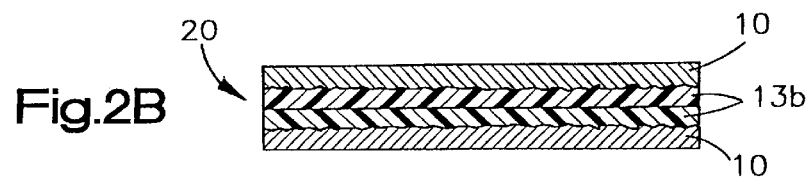
FIG. 2b is the components of FIG. 2a laminated to form a circuit board element.

Referring to FIGS. 2a and 2b another embodiment of the present invention is shown. In this embodiment a pair of copper sheets 10 are coated each on one side thereof with a dielectric material 13a. The material may be epoxy of the type previously described, or other types of dielectric material could be used, such as, a cyanate ester, a polyimide, or polytetrafluoroethlyene (PTFE). The dielectric materials, other than the impregnated glass cloth may be applied as liquids or in the case of polyimide and PTFE be in the form of free standing films of material. The material is partially cured as described previously, or in the case of films or glass cloth may be applied to the copper in the partially cured form, and the sheets of copper 10 with the dielectric material 13a thereon are laminated together to form structure 20, shown in FIG. 2b comprised of two sheets of copper 10 separated by two sheets of fully cured dielectric material 13b. The total thickness of the two dielectric layers 13b together should not exceed about 4 mils and preferably should not exceed about 3 mils. The structure can be further processed into a circuit board or chip carrier as previously described. The term partially cured and fully cured material is used herein to denote specifically the curing of thermoset resins by cross linking, the partial cure referring to less than complete cross linking and full cure referring to a more complete cross linking. (The terms partial cure and full cure may also sometimes be used herein in referring to thermoplastics. In such case heating of the thermoplastic causes a softening of the material which sometimes is referred to herein as partial cure and cooling causes the material to harden sometimes referred to herein as complete cure; although sometimes the more appropriate terms "softened" and "hardened" are used when referring specifically to thermoplastics.)

Figure 3A:
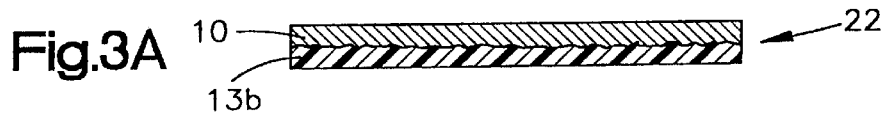
FIG. 3a is a side elevational of the first step in forming a circuit board according to yet another embodiment of this invention.
Figure 3B:
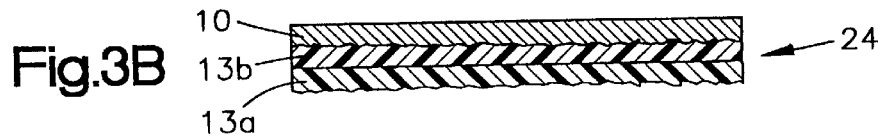
FIG. 3b depicts the step following that shown in FIG. 3a in the manufacture of the circuit board element.
Figure 3C:
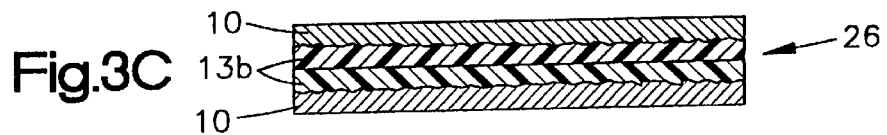
FIG. 3c depicts the final lamination step after that shown in FIG. 3b in the manufacture of the circuit board element.

Referring to FIGS. 3a–3c yet another embodiment of the invention is shown. In this embodiment a layer of dielectric material 13b such as an epoxy is applied to a copper sheet 10 and fully cured to form the component structure 22 as shown in FIG. 3a. Following this a layer of dielectric material 13a preferably also an epoxy is applied to the layer 13b of dielectric material and partially cured to form component structure 24 as shown in FIG. 3b. Thereafter a sheet of copper 10 is laminated to the layer of dielectric material 13a, the lamination fully curing the layer 13a of FIG. 3b to form the composite structure 26 shown in FIG. 3c of two sheets of dielectric material 13b laminated between two sheets of copper 10.

Figure 4A:
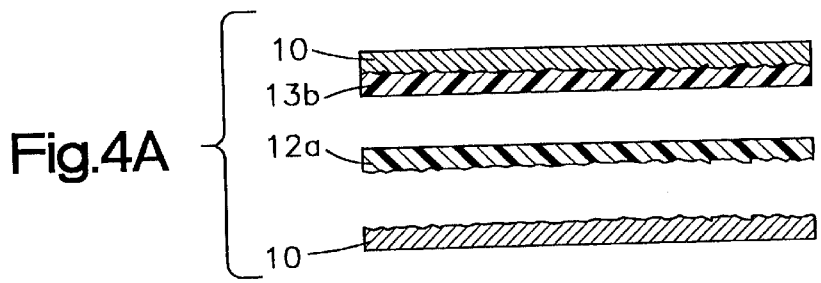
FIG. 4a is a side elevational view showing the components ready for lamination of still a further embodiment of this invention.
Figure 4B:
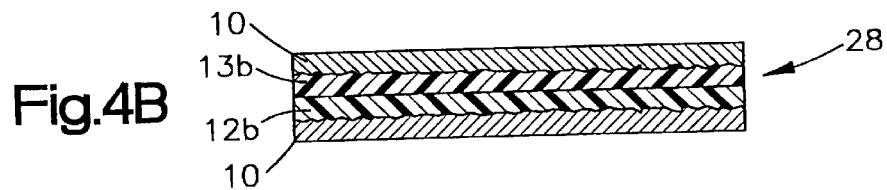

Referring now to FIGS. 4a and 4b still another embodiment of the invention is shown. FIG. 4a shows the components ready to be laminated, which components include a sheet of copper 10 having coated thereon a coating of epoxy 13b which is fully cured. (It should be noted that the epoxy 13b could be only partially cured if desired.) A sheet of glass cloth impregnated with epoxy resin and partially cured 12a is provided as well as a second sheet of copper 10. (The second sheet of copper 10 can optionally be coated with a dielectric material also.) The components of FIG. 4a are then laminated to form the structure 28 shown in FIG. 4b. This embodiment illustrates how different forms of the epoxy can be used.

Figure 5A:
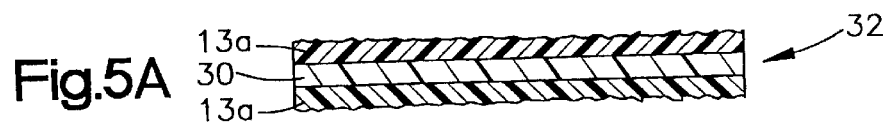
FIG. 5a is a side elevational view depicting the structure of one component of a circuit board according to still another embodiment of this invention.
Figure 5B:
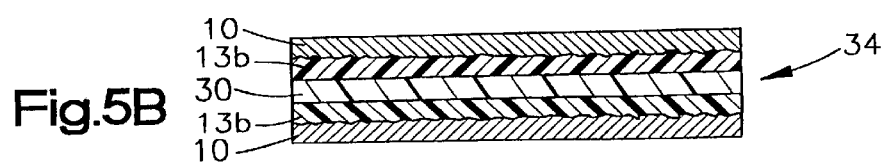

Referring to FIGS. 5a and 5b still another embodiment of the invention is shown which depicts one way in which several different dielectric materials are combined. As shown in FIG. 5a a sheet of polyimide 30 is coated on each side with a layer of epoxy 13a which epoxy is partially cured to form a dielectric component 32. A pair of copper sheets 10 are laminated one to each of the layers of epoxy and as described previously the epoxy fully cures during lamination to form composite structure 34 of a dielectric material formed of a sheet of polyimide 30 and two layers of fully cured epoxy 13b sandwiched between a pair of copper sheets 10 as shown in FIG. 5b.

In the embodiments shown the capacitance, according to the formula given above, should be at least about 500 pico farads per square inch for elements having a dielectric thickness of about 2 mils, and at least about 250 pico farads per square inch for elements having a thickness of about 4 mils.

It should be noted that in all of the embodiments shown one or more of the layers of dielectric material may be filled with particulate matter having a high dielectric constants, such as for example, but without limitation, barium titanate, strontium titanate, lead-zirconium titanate, and tantalum oxide. The particle size can range from about 0.1 micron up to about one-half the thickness of the layer containing the particulate material. It is preferred that there be a range of sizes of the particles to promote increased volumetric packing efficiency and hence an increased dielectric constant e. Such loading will increase the capacitance somewhat.

Figure 6:
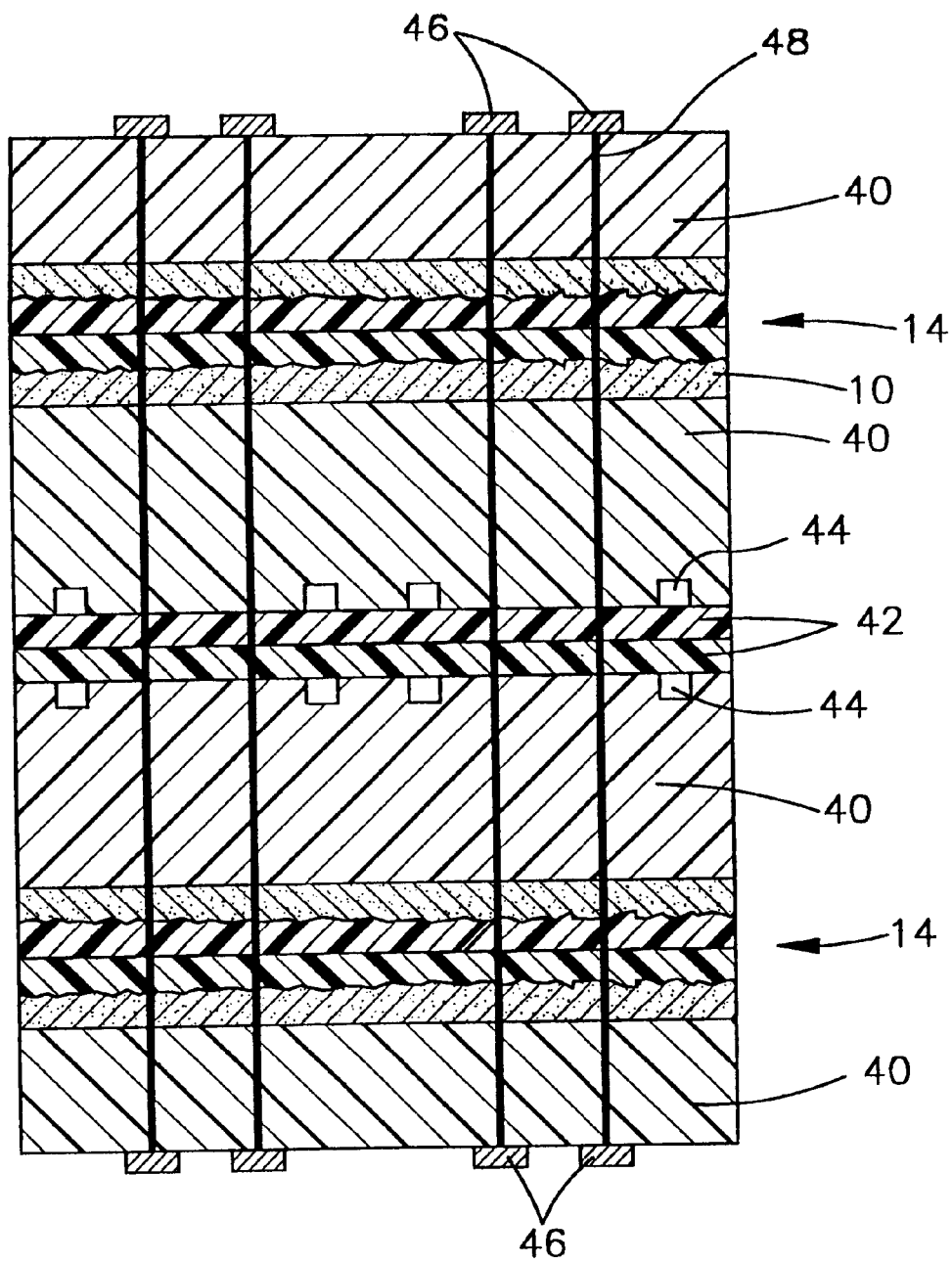
FIG. 6 is a longitunal sectional view of two capacitive elements used to form a completed circuit board.

FIG. 6 shows in cross section a circuit board utilizing two capacitive elements of the type shown in FIG. 1D. It is to be understood, however, that other capacitive elements of this invention such as those shown in FIGS. 2B, 3C, 4B or 5B could also be utilized.

Shown in FIG. 6 are a pair of capacitive elements 14 of the type shown in FIG. 1D each having laminated to the copper sheet 10 on each side thereof, a layer of dielectric material 40. A signal core comprised of dielectric material 42 and circuitry 44 formed on both sides of a dielectric material 42 is placed between a pair of capacitive elements 14, and adjacent to dielectric material 40. Also circuitry 46 is formed on the exposed surfaces of each of the sheets of dielectric material 40. Plated through holes 48 are formed to connect the circuitry 44, 46 and appropriate copper sheets 10 which form voltage and power planes.

In a preferred technique for forming the circuit board a pair of dielectric layers 42 with the circuitry 44 thereon are provided as preformed signal planes, and the dielectric layers 40 are all provided as b stage cured sticker sheets of fiber glass impregnated with epoxy. These are stacked up with the capacitive elements and a sheet of copper foil applied to each of the exposed surfaces of the sticker sheets 40 where the circuitry 46 is to be formed. The stack is laminated together under heat and pressure sufficient to fully cure the sticker sheets and bond all of the components together. The through holes are then drilled and the holes plated with copper. The surface of the copper foil is also plated. The external circuit features 46 are then defined by standard photo lithographic and copper etch techniques. These processes to form the circuit board are all well known in the art.

It also should be understood that additional capacitive elements and signal planes could be employed, as well as the other configurations of the capacitive elements. Also other techniques well known in the art could be employed to form the circuit board.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A capacitive element, comprising:
   at least two sheets of thermoplastic or thermosetting resinous dielectric material, each sheet containing at least one resin impregnated sheet of glass cloth and having a thickness of between about 1 mil and about 2 mils, said sheets of dielectric material being bonded together to form a dielectric component having a thickness of between about 2 mils and about 4 mils;
   first and second sheets of conductive material;
   said dielectric component being laminated between said first and second sheets of conductive material and being fully cured or hardened.

2. The capacitive element according to claim 1 wherein three sheets of dielectric material are bonded together to form the dielectric component.

3. The capacitive element according to claim 1 wherein the at least two sheets are formed from different materials.

4. The invention as defined in claim 1 wherein the sheets of cloth incorporate an epoxy resin which is fully cured.

* * * * *